(12) United States Patent
Lee et al.

(10) Patent No.: US 12,716,928 B2
(45) Date of Patent: Aug. 25, 2026

(54) ELECTRONIC DEVICE FOR INSPECTING CABLE, AND INSPECTION METHOD

(71) Applicant: Samsung Electronics Co., Ltd., Suwon-si (KR)

(72) Inventors: Soonyong Lee, Suwon-si (KR); Youngkun Kwon, Suwon-si (KR); Kwangho Kim, Suwon-si (KR); Jaemin Ryoo, Suwon-si (KR); Hoyong Kim, Suwon-si (KR); Minkun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 273 days.

(21) Appl. No.: 18/364,368

(22) Filed: Aug. 2, 2023

(65) Prior Publication Data

US 2023/0375608 A1 Nov. 23, 2023

Related U.S. Application Data

(63) Continuation of application No. PCT/KR2022/002081, filed on Feb. 11, 2022.

(30) Foreign Application Priority Data

Mar. 25, 2021 (KR) ........................ 10-2021-0038632

(51) Int. Cl.
*G01R 31/52* (2020.01)
*G01R 31/08* (2020.01)
*G01R 31/58* (2020.01)

(52) U.S. Cl.
CPC .......... *G01R 31/083* (2013.01); *G01R 31/52* (2020.01); *G01R 31/58* (2020.01)

(58) Field of Classification Search
CPC ............ G01R 31/08–086; G01R 31/12; G01R 31/50–55; G01R 31/58–60; G01R 31/66–71
See application file for complete search history.

(56) References Cited

U.S. PATENT DOCUMENTS 6,230,109 B1 5/2001 Miskimins et al.
2002/0171434 A1* 11/2002 Stanford ............ G01R 31/1272 324/541

(Continued)

FOREIGN PATENT DOCUMENTS

JP H0915290 A 1/1997
JP 2016099145 A 5/2016

(Continued)

OTHER PUBLICATIONS

International Search Report for PCT/KR2022/002081 mailed May 2, 2022, 4 pages.

(Continued)

*Primary Examiner* — Lee E Rodak
*Assistant Examiner* — Demetrius R Pretlow
(74) *Attorney, Agent, or Firm* — NIXON & VANDERHYE P.C.

(57) ABSTRACT

An electronic device for inspecting a cable, and an inspection method are disclosed. The electronic device for inspecting a cable, according to an embodiment, comprises: a main substrate; an input substrate; and an output substrate, wherein the main substrate comprises: a first selector including a plurality of first pins; a second selector including a plurality of second pins; a processor; and a power supply for supplying power to the electronic device, and the processor may be configured to: identify a fastening relationship of the cable connected to the electronic device, determine a pin map including information about shorting or opening of the first pins and the second pins on the basis of the fastening (Continued)

relationship, determine shorting or opening of the first pins and the second pins using the pin map, and determine the state of the cable according to the determination result.

16 Claims, 6 Drawing Sheets

(56) References Cited

U.S. PATENT DOCUMENTS

2004/0160227 A1* 8/2004 Piesinger ............... G01R 31/58 324/66
2020/0333382 A1 10/2020 Lee

FOREIGN PATENT DOCUMENTS

KR 20000067032 A 11/2000
KR 20080043430 A 5/2008
KR 20160073127 A 6/2016
KR 101803438 B1 11/2017
KR 101853192 B1 4/2018
KR 102037434 B1 10/2019
KR 102101317 B1 * 5/2020 ............. G01R 31/67
KR 102328803 B1 11/2021

OTHER PUBLICATIONS

Written Opinion of the ISA for PCT/KR2022/002081 mailed May 2, 2022, 4 pages.
Korean Office Action issued May 2, 2025 in corresponding Korean Patent Application No. 10-2021-0038632.

* cited by examiner

ELECTRONIC DEVICE FOR INSPECTING CABLE, AND INSPECTION METHOD

CROSS-REFERENCE TO RELATED APPLICATIONS

This application is a continuation of International Application No. PCT/KR2022/002081 designating the United States, filed on Feb. 11, 2022, in the Korean Intellectual Property Receiving Office and claiming priority to Korean Patent Application No. 10-2021-0038632, filed on Mar. 25, 2021, in the Korean Intellectual Property Office, the disclosures of each of which are incorporated by reference herein in their entireties.

BACKGROUND

Field

The disclosure relates to an electronic device for inspecting a cable and an inspection method.

Description of Related Art

In a process of manufacturing a cable, a process for inspecting a defective cable after manufacturing the cable is required. A conventional inspection device may inspect shorting and opening for lines connected in a cable but may not inspect cold soldering of the cable and crossing of adjacent pins.

In order to inspect cold soldering of a cable and crossing thereof, a complicated process is required separately and difficult to implement, so that detecting a cable with the cold soldering and the crossing issue is difficult. Therefore, technology for inspecting not only opening and shorting but also cold soldering and crossing of a cable is required.

SUMMARY

Embodiments of the disclosure provide an electronic device and an inspection method for easily and quickly inspecting opening, shorting, and cold soldering of a cable and crossing between adjacent pins.

According to an example embodiment, an electronic device for inspecting a cable includes: a main substrate configured to perform an inspection of the cable, an input substrate electrically connected to the main substrate and the cable, and an output substrate electrically connected to the main substrate and the cable and connected to the input substrate through the cable, wherein the main substrate may include a first selector electrically connected to the output substrate and including a plurality of first pins, a second selector electrically connected to the input substrate and including a plurality of second pins, a processor electrically connected to the first selector and the second selector, and a power supply configured to supply power to the electronic device, wherein the processor may be configured to: identify a connecting type of the cable connected to the electronic device, determine a pin map including information about shorting or opening of the first pins and the second pins based on the connecting type, determine shorting or opening of the first pins and the second pins using the pin map, and determine a state of the cable according to a result of the determining of shorting or opening of the first pins and the second pins.

According to an example embodiment, a method of inspecting a cable includes: identifying a connecting type of a cable connected to an electronic device, determining a pin map including information about shorting or opening of first pins and second pins of the electronic device based on the connecting type, determining shorting or opening of the first pins and the second pins using the pin map, and determining a state of the cable according to a result of the determining of shorting or opening of the first pins and the second pins, wherein the electronic device may include a main substrate configured to perform an inspection of the cable, an input substrate electrically connected to the main substrate and the cable, and an output substrate electrically connected to the main substrate and the cable and connected to the input substrate through the cable, wherein the main substrate may include a first selector electrically connected to the output substrate and including the plurality of first pins, and a second selector electrically connected to the input substrate and including the plurality of second pins.

According to various example embodiments of the disclosure, opening, shorting, and cold soldering of a cable and crossing between adjacent pins may be easily and quickly inspected.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
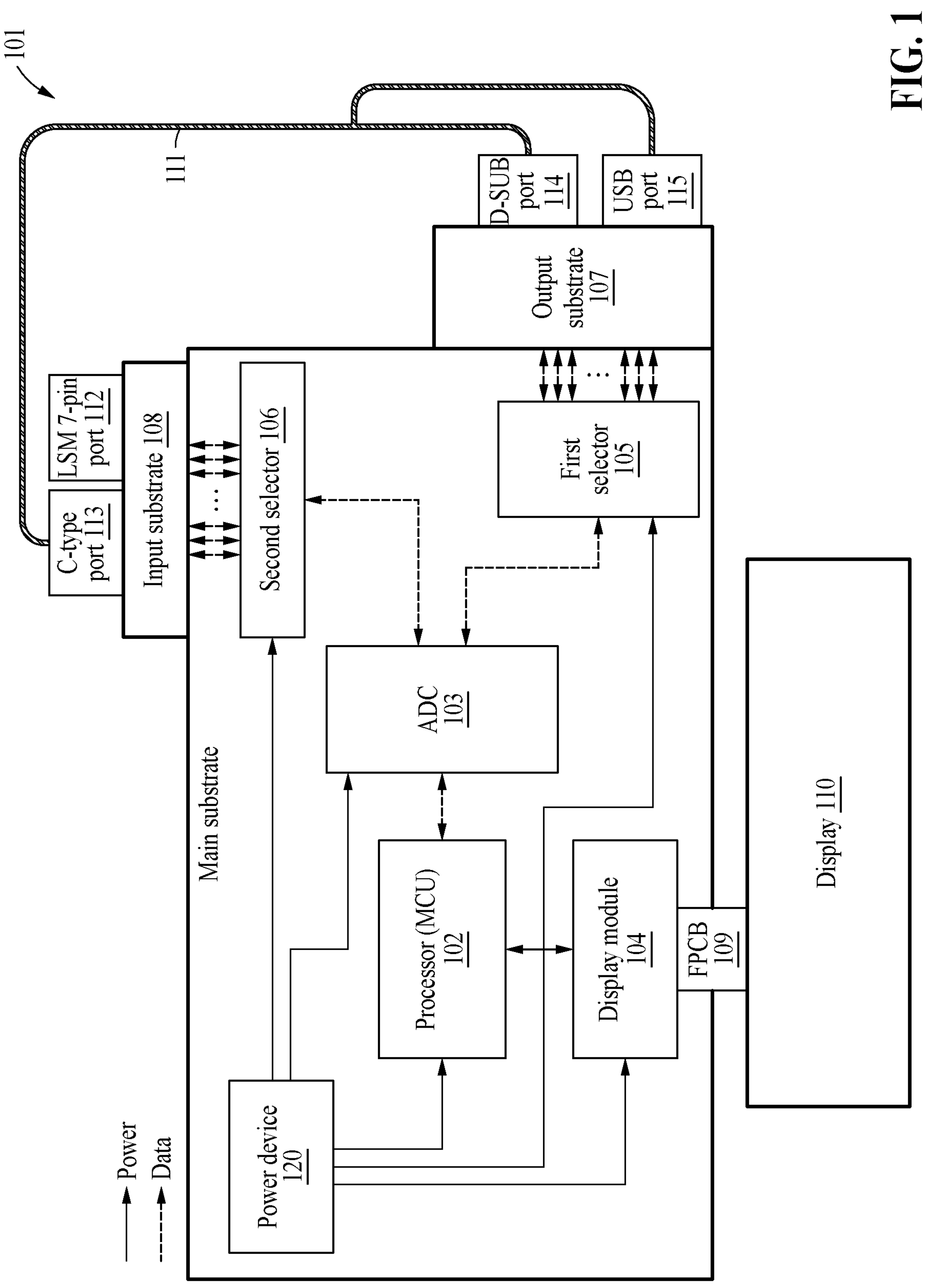
FIG. 1 is a block diagram illustrating an example configuration of an electronic device according to various embodiments.

Hereinafter, various example embodiments will be described in greater detail with reference to the accompanying drawings. When describing the example embodiments with reference to the accompanying drawings, regardless of drawing numerals, like reference numerals refer to like elements and a repeated description related thereto may not be provided.

FIG. 1 is a block diagram illustrating an example configuration of an electronic device according to various embodiments.

An electronic device 101 according to an embodiment of the present disclosure, as the electronic device 101 that inspects a cable 111, may compile a pin map into a library and may determine a state of the cable 111 by inspecting not only shorting and opening but also cold soldering and crossing of the cable 111 based on the pin map. A specific method for the electronic device 101 to inspect the shorting, opening, cold soldering, and crossing of the cable 111 using the pin map is described in greater detail below with reference to FIG. 2.

Referring to FIG. 1, the electronic device 101 according to an embodiment of the present disclosure may include a main substrate, an input substrate 108, and an output substrate 107. The main substrate may include a power device (e.g., a power supply) 120, a processor (e.g., including processing circuitry) 102, an analog-to-digital converter (ADC) 103, a display module (e.g., including display circuitry) 104, a first selector 105, a second selector 106, a flexible printed circuit board (FPCB) 109, and a display 110.

According to an embodiment, the input substrate 108 may be a substrate connected to an input terminal of the cable 111. The input substrate 108 may include a C-type port 113 and LSM 7-pin port 112. The input substrate 108 may include a variety of ports other than the ports described and is not limited to the ports described. The input substrate 108 may be electrically connected to the main substrate of the electronic device 101 through a connector (e.g., a 34-pin connector).

According to an embodiment, since the input substrate 108 is detachable from the main substrate of the electronic device 101, even if the port of the input substrate 108 is worn out, the input substrate 108 may be easily replaced and an input substrate 108 including a new type of port may be used in the present disclosure.

According to an embodiment, the output substrate 107 may be a substrate connected to an output terminal of the cable 111. The output substrate 107 may include a D-subminiature (D-SUB) port 114 and a Universal Serial Bus (USB) port 115. The output substrate 107 may include a variety of ports other than the ports described and is not limited to the ports described. The output substrate 107 may be electrically connected to the main substrate of the electronic device 101 through a connector (e.g., a 34-pin connector).

According to an embodiment, since the output substrate 107 is detachable from the main substrate of the electronic device 101, even if the port of the output substrate 107 is worn out, the output substrate 107 may be easily replaced and an output substrate 107 including a new type of port may be used in the present disclosure.

Referring to FIG. 1, the cable 111 may be connected to the C-type port 113 of the input substrate 108, and the D-SUB port 114 and the USB port 115 of the output substrate 107. According to an embodiment, a connecting type of the cable 111 in FIG. 1 may be the C-type port 113, the D-SUB port 114, and the USB port 115.

The processor 102 may include various processing circuitry and perform operations according to various embodiments of the present disclosure. The power device 120 may include a power supply and may supply power to all components of the electronic device 101 (e.g., the main substrate, the input substrate 108, and the output substrate 107).

The first selector 105 may be electrically connected to the output substrate 107 and may include a plurality of first pins and switches. The second selector 106 may be electrically connected to the input substrate 108 and may include a plurality of second pins and switches. The ADC 103 may convert an analog signal into a digital signal.

A first pin refers to a pin included in the first selector 105 and may be electrically connected to a second pin. The second pin refers to a pin included in the second selector 106 and may be electrically connected to the first pin.

According to an embodiment, a current applied to the first selector 105 through a switch included in the first selector 105 may be applied to one first pin. A current transmitted from the first pin through a switch included in the second selector 106 may be received by one second pin.

The display module 104 may include various circuitry and visually provide information to the outside (e.g., a user) of the electronic device 101. The display module 104 may include, for example, a display, a hologram device, or a projector and a control circuit for controlling the corresponding device.

The display module 104 may be connected to the display 110 through the FPCB 109. The display 110 may display an interface related to the inspection of the cable 111. The interface related with the cable 111 may include an interface providing a setting menu related to the inspection and an interface displaying an inspection result.

According to an embodiment, the display 110 may include a touch sensor configured to detect a touch or a pressure sensor configured to measure the strength of a force from a touch. The processor 102 may process an instruction based on a user's input received through a touch panel. The user's input may be received by the electronic device 101 through an input module such as a keyboard, mouse, or stylus pen, rather than a touch panel.

Figure 2:
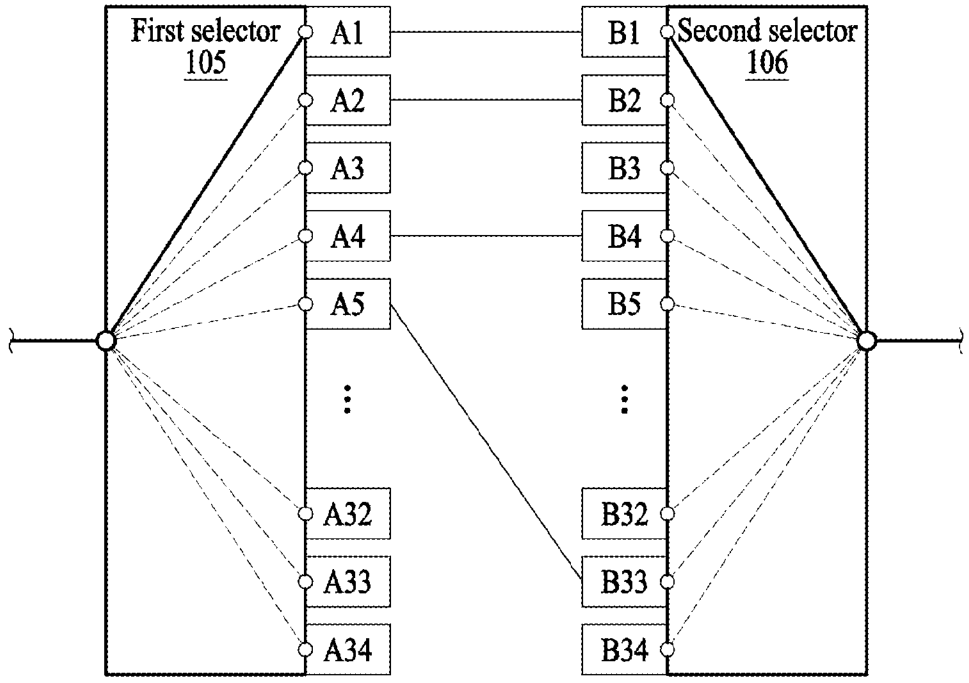
FIG. 2 is a diagram illustrating a connection state of pins according to various embodiments.

FIG. 2 is a diagram illustrating an example connection state of pins according to various embodiments.

In FIG. 2, pins A1 to A34 may be first pins included in the first selector 105 and pins B1 to B34 may be second pins included in the second selector 106. A connecting type of the cable 111 connected to the electronic device 101 may be identified. The connecting type thereof may refer to connection between the ports (e.g., 112 and 113 of FIG. 1) of the input substrate 108 connected with the cable 111 and the ports (e.g., 114 and 115 of FIG. 1) of the output substrate 107 connected with the cable 111. Depending on the connecting type, whether the first pins and the second pins are shorting or opening may vary.

A pin map may define a second pin corresponding to each first pin for each connecting type and may include information on whether the first pin and the second pin corresponding to the first pin are shorting or opening. Since the pin map is compiled into a library for each connecting type, the electronic device 101 may determine a pin map for the connecting type of the cable 111. The pin map may be updated, and information about shorting or opening of a new connecting type may be added. A user may perform an inspection of the cable 111 by importing an updated pin map.

The electronic device 101 may determine shorting or opening of the first pins and the second pins using the pin map and may determine a state of the cable 111 according to a result of the determining. The electronic device 101 may determine the state of the cable 111 by comparing the determined shorting or opening of the first pin or the second pin with the shorting or opening defined in the pin map.

The electronic device 101 may determine the cable 111 to be in an abnormal state when the determined shorting or opening is different from the shorting or opening defined in the pin map. For example, when the first pin and the determined second pin are defined as shorting in the pin map determined according to the connecting type and the first pin and the determined second pin are determined to be opening or cold soldering, the electronic device 101 may determine the cable 111 to be in an abnormal state.

For example, when the first pin and the determined second pin are defined as opening in the pin map determined according to the connecting type and the first pin and the determined second pin are determined to be shorting or cold soldering, the electronic device 101 may determine the cable 111 to be in an abnormal state.

The electronic device 101 may determine a second pin corresponding to the first pin based on the pin map determined according to the connecting type. For example, referring to FIG. 2, when a pin A1 and a pin B1 are defined as shorting in the pin map, the electronic device 101 may determine the pin B1 as a second pin corresponding to the pin A1, the first pin.

For example, referring to FIG. 2, when a pin A3 and a pin B3 are defined as opening (e.g., open) in the pin map, the electronic device 101 may determine the pin B3 as a second pin corresponding to the pin A3, the first pin.

The electronic device 101 may apply a current greater than or equal to a reference level to the first pin and may determine the resistance between the first pin and the determined second pin by receiving the applied current through the determined second pin. According to an embodiment, a current applied to the first selector 105 through a switch included in the first selector 105 may be applied to one first pin. A current transmitted from the first pin through a switch included in the second selector 106 may be received by one second pin.

For example, the electronic device 101 may apply a current greater than or equal to the reference level to the first selector 105, may allow the current to be applied to a first pin (e.g., the pin A1) through a switch of the first selector 105, and may determine the resistance between the first pin (e.g., the pin A1) and the determined second pin (e.g., the pin B1) by receiving the current through the second pin (e.g., the pin B1) determined through the switch of the second selector 106. According to an embodiment, the electronic device 101 may determine the resistance between pins based on the ratio of a current applied to the first selector 105 and a voltage of the second selector 106.

The electronic device 101 may determine shorting or opening of the first pin and the determined second pin based on the resistance. When the resistance is less than a shorting threshold, the electronic device 101 may determine the first pin and the determined second pin as shorting, and when the resistance is greater than or equal to an opening threshold that is higher than the shorting threshold, the electronic device 101 may determine the first pin and the determined second pin as opening. The electronic device 101 may determine the first pin and the determined second pin as cold soldering, when the resistance is greater than or equal to a shorting threshold and less than an opening threshold.

According to an embodiment, the shorting, cold soldering, and opening may be determined by referring to the resistance ranges listed in the table below.

TABLE 1

| | |
|---|---|
| Shorting | 0.00 Ω to 2.99 Ω |
| Cold soldering | 3.00 Ω to 29.99 Ω |
| Opening | 30.00 Ω to 33.00 Ω |

In Table 1, the shorting threshold may be 3Ω and the opening threshold may be 30Ω. Theoretically, the resistance may be 0Ω in case of shorting and infinity (∞) in case of opening, but the shorting threshold and the opening threshold may be determined considering the characteristics of a chip used in an inspection device. However, the shorting threshold and the opening threshold may not be limited to the described example and may be set differently depending on the type of the cable 111 or other environments.

The electronic device 101 may determine the cable 111 to be in an abnormal state, when the first pin and the determined second pin are defined as shorting in the determined pin map and the first pin and the determined second pin are determined to be opening or cold soldering.

For example, referring to FIG. 2, since the pin A1, the first pin, is connected to the pin B1, the second pin, the pin A1 and the pin B1 may be defined as shorting in the pin map. The electronic device 101 may measure the resistance between the pin A1 and the pin B1 by applying a current to the pin A1 and controlling the switch to receive the current through the pin B1.

When the resistance between the pin A1 and the pin B1 is greater than or equal to the shorting threshold, the electronic device 101 may determine the cable 111 to be in an abnormal state. The electronic device 101 may determine the pin A1 and the pin B1 to be in a normal state when the resistance between the pin A1 and the pin B1 is less than the shorting threshold.

The electronic device 101 may determine the cable 111 to be in an abnormal state, when the first pin and the determined second pin are defined as opening in the determined pin map and the first pin and the determined second pin are determined to be shorting or cold soldering.

For example, referring to FIG. 2, since the pin A3, the first pin, is connected to the pin B3, the second pin, the pin A3 and the pin B3 may be defined as opening in the pin map. The electronic device 101 may measure the resistance between the pin A3 and the pin B3 by applying a current to the pin A3 and controlling the switch to receive the current through the pin B3.

The electronic device 101 may determine the cable 111 to be in an abnormal state, when the resistance between the pin A3 and the pin B3 is less than the opening threshold. The electronic device 101 may determine the pin A3 and the pin B3 to be in a normal state when the resistance between the pin A3 and the pin B3 is greater than or equal to the opening threshold.

After determining all the shorting or opening of the first pins and the second pins, the electronic device 101 may determine crossing of the first pin. According to an embodiment, the electronic device 101 may apply a current greater than or equal to the reference level to the first pin, may determine the resistance between the first pin and a second pin adjacent to the determined second pin by receiving the applied current through the second pin adjacent to the determined second pin, and may determine crossing of the first pin based on the resistance.

The second pin adjacent to the determined second pin may be a second pin closest to the second pin determined according to the pin map and may be a second pin to be inspected next to the second pin determined according to the pin map.

For example, referring to FIG. 2, when a pin A5, the first pin, and a pin B32, the second pin, are defined as shorting (e.g., shorted) in the pin map, since the pin A5 and the pin B32 are actually opening, the resistance measured by applying a current to the pin A5 and receiving the current through the pin B32 by the electronic device 101 may be higher than the shorting threshold.

According to an embodiment, the electronic device 101 may inspect crossing of the pin A5 by measuring the resistance between the first pin (e.g., the pin A5) and a second pin (e.g., a pin B33) adjacent to the determined second pin (e.g., the pin B32). The electronic device 101 may measure the resistance between the pin A5 and the pin B33 by applying a current to the pin A5 and receiving the current through the pin B33. The electronic device 101 may determine the crossing of the first pin based on the measured resistance.

For example, referring to FIG. 2, since the pin A5 and the pin B33 are shorting, the resistance measured by applying a current to the pin A5 and receiving the current through the pin B32 by the electronic device 101 may be less than the shorting threshold. In this case, the electronic device 101 may determine the pin A5 to be crossing, since the pin A5 and the pin B33 are shorting.

Figure 3:
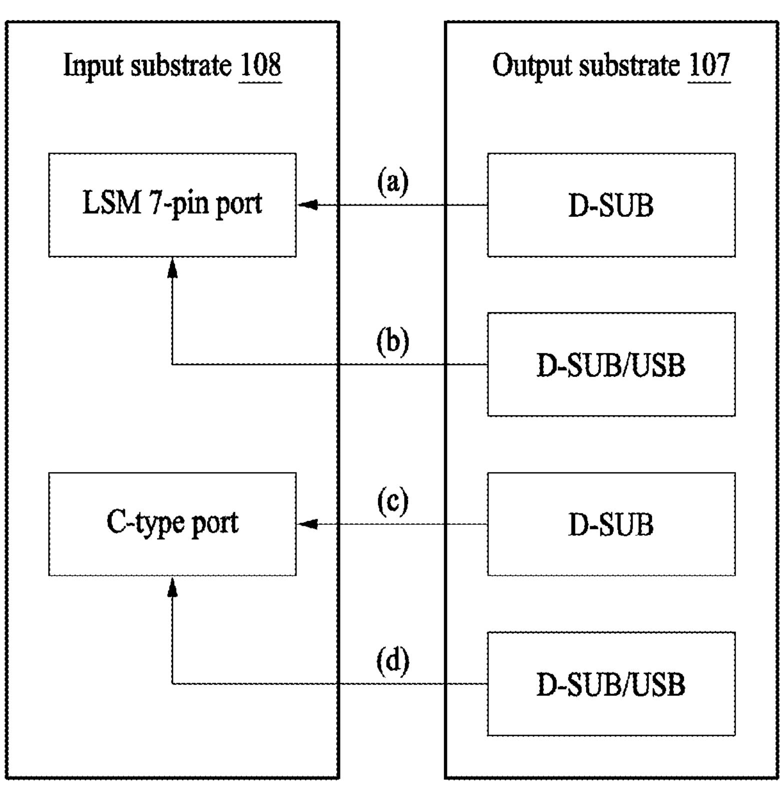
FIG. 3 is a diagram illustrating a connecting type between an input substrate and an output substrate according to various embodiments.

FIG. 3 is a diagram illustrating an example connection relationship between the input substrate 108 and the output substrate 107 according to various embodiments.

(a), (b), (c) and (d) of FIG. 3 may refer to different connecting types of the cable 111 to be inspected. The connecting type of (a) of FIG. 3 may be an LSM 7-pin port (e.g., 112 of FIG. 1) of the input substrate 108 and a D-SUB port (e.g., 114 of FIG. 1) of the output substrate 107. The connecting type of (b) of FIG. 3 may be the LSM 7 pin port of the input substrate 108, and the D-SUB port and a USB port (e.g., 115 of FIG. 1) of the output substrate 107.

The connecting type of (c) of FIG. 3 may be a C-type port (e.g., 113 of FIG. 1) of the input substrate 108 and the D-SUB port of the output substrate 107. The connecting type of (d) of FIG. 3 may be the C-type port of the input substrate 108, and the D-SUB port and the USB port of the output substrate 107. According to an embodiment, since the input substrate 108 and the output substrate 107 are detachable from the main substrate, an inspection for the connecting types of various cables 111 may be possible in addition to the example described with reference to FIG. 3.

Figure 4:
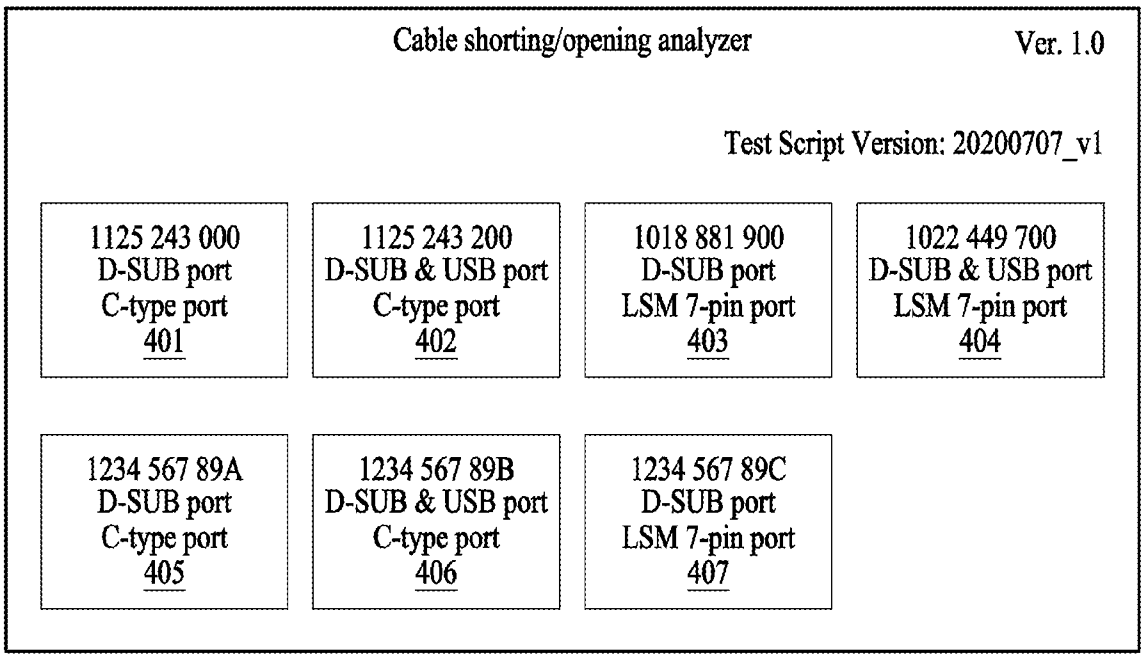
FIG. 4 is a diagram illustrating an interface for selecting a cable to be inspected according to various embodiments.

FIG. 4 is a diagram illustrating an example interface for selecting the cable 111 to be inspected according to various embodiments.

Referring to FIG. 4, the electronic device 101 may display various types of connecting types on the display 110. When a connecting type is selected, a pin map for the selected connecting type may be imported. A user may determine the connecting type and the cable 111 to be inspected using the interface of FIG. 4.

Referring to FIG. 4, each of buttons 401, 402, 403, 404, 405, 406 and 407 of the interface may provide information about the number of cables 111 and the connecting type. For example, when the user clicks a specific button, the electronic device 101 may import a pin map for the connecting type corresponding to the selected button and may perform an inspection of the cable 111 connected to the electronic device 101.

As for the connecting type, various connecting types other than the connecting type illustrated in FIG. 4 may be supported, and an inspection for a new type of connecting type may be performed by updating the pin map. The interface of FIG. 4 is not limited to the illustrated example, and interfaces of various structures may be used.

Figure 5A:
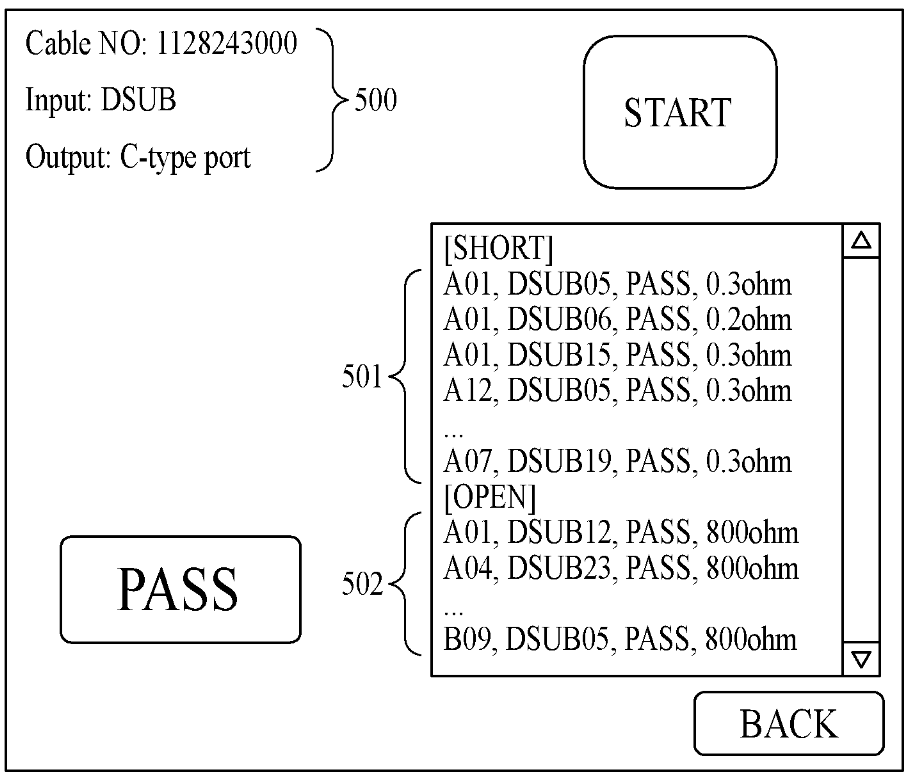
FIGS. 5A and 5B are diagrams illustrating an interface representing an inspection result according to various embodiments.
Figure 5B:
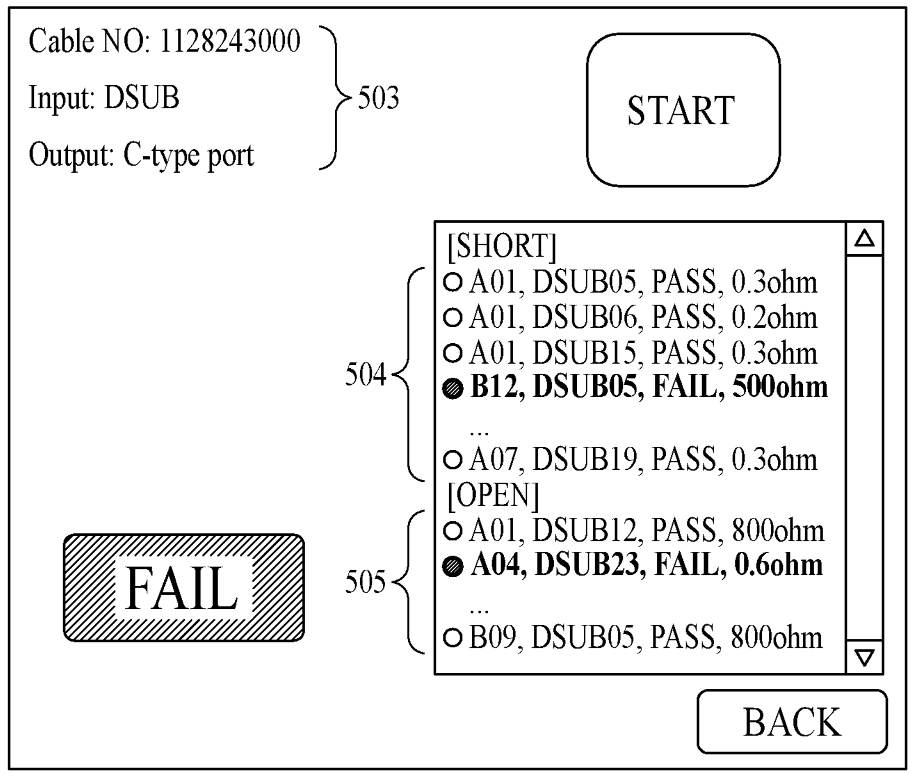

FIGS. 5A and 5B are diagrams illustrating an example interface representing an inspection result according to various embodiments.

The interface of FIGS. 5A and 5B may include information 500 and information 503 about the type and connecting type of the cable 111 to be inspected, results 501, 502, 504, and 505 of determining shorting or opening of pins, a state of the cable 111 (e.g., PASS or FAIL), and a button for inspection progress.

A user may check the inspection result of the cable 111 using the interface of FIGS. 5A and 5B. The interface of FIG. 5A and FIG. 5B is not limited to the example illustrated, and interfaces of various structures available to those skilled in the art may be used.

According to an embodiment, the electronic device 101 may inspect shorting or opening of each of the first and second pins according to an order defined in the pin map. FIG. 5A is a diagram illustrating an example of an interface appearing when the cable 111 is determined to be in a normal state. In FIG. 5A, referring to the inspection result 501 for the first pin and the second pin defined as shorting in the pin map, the electronic device 101 may determine both the first pin and the second pin to be shorting, so that all results may appear as “PASS”.

For example, in FIG. 5A, a pin A01 and a pin DSUB05 are defined as shorting in the pin map, and by applying a current greater than or equal to a reference level to the pin A01 and receiving the applied current through the pin DSUB05 by the electronic device 101, the resistance between the pin A01 and the pin DSUB05 may be measured. When the resistance between the pin A01 and the pin DSUB05 (e.g., 0.3 ohms) is less than or equal to a shorting threshold, the electronic device 101 may determine the pin A01 and the pin DSUB05 to be in a normal state and may display “PASS”. The electronic device 101 may inspect shorting of the first pin and the second pin to be inspected next.

In FIG. 5A, referring to the result of determining 502 for the first pin and the second pin defined as opening in the pin map, the electronic device 101 may determine both the first pin and the second pin to be opening, so that all results may appear as “PASS”.

For example, in FIG. 5A, the pin A01 and a pin DSUB 12 are defined as opening in the pin map, and by applying a current greater than or equal to a reference level to the pin A01 and receiving the applied current through the pin DSUB 12 by the electronic device 101, the resistance between the pin A01 and the pin DSUB 12 may be measured. When the resistance between the pin A01 and the pin DSUB 12 (e.g., 800 ohms) is greater than or equal to an opening threshold, the electronic device 101 may determine the pin A01 and the pin DSUB 12 to be in a normal state and may display “PASS”. The electronic device 101 may inspect opening of the first pin and the second pin to be inspected next.

FIG. 5B is a diagram illustrating an example of an interface appearing when the cable 111 is determined to be in an abnormal state. In FIG. 5B, referring to the result of determining 504 for the first pin and the second pin defined as shorting in the pin map, the resistance of a pin B12 and the pin DSUB 05 is determined to be greater than the shorting threshold, so that the cable 111 is determined to be in an abnormal state and “FAIL” may be displayed.

For example, in FIG. 5B, the pin B12 and the pin DSUB 05 are defined as shorting in the pin map, and by applying a current greater than or equal to a reference level to the pin B12 and receiving the applied current through the pin DSUB 05 by the electronic device 101, the resistance between the pin B12 and the pin DSUB 05 may be measured.

Since the resistance between the pin B12 and the pin DSUB 05 (e.g., 500 ohms) is greater than the shorting threshold, the electronic device 101 may determine the pin B12 and the pin DSUB 05 to be in an abnormal state and may display “FAIL”. The electronic device 101 may inspect shorting of the first pin and the second pin to be inspected next.

In FIG. 5B, referring to the result of determining 505 for the first pin and the second pin defined as opening in the pin map, the resistance of a pin A04 and a pin DSUB 23 is determined to be less than the opening threshold, so that the cable 111 is determined to be in an abnormal state and “FAIL” may be displayed.

For example, in FIG. 5B, the pin A04 and the pin DSUB 23 are defined as opening in the pin map, and by applying a current greater than or equal to a reference level to the pin A04 and receiving the applied current through the pin DSUB 23 by the electronic device 101, the resistance between the pin A04 and the pin DSUB 23 may be measured.

Since the resistance between the pin A04 and the pin DSUB 23 (e.g., 0.6 ohms) is less than the opening threshold, the electronic device 101 may determine the pin A04 and the pin DSUB 23 to be in an abnormal state and may display "FAIL". The electronic device 101 may inspect shorting of the first pin and the second pin to be inspected next.

The electronic device 101 may determine crossing of the first pin, after performing the inspection for the shorting and opening defined in the pin map. For example, referring to FIGS. 5A and 5B, the pin A01 and the pin DSUB 12 are defined as opening in the pin map, and by applying a current greater than or equal to a reference level to the pin A01 and receiving the applied current through the pin DSUB 13 by the electronic device 101, the resistance between the pin A01 and the pin DSUB 13 may be measured. When the measured resistance is less than the shorting threshold, the electronic device 101 may determine the pin A01 to be crossing since the pin A01 and the pin DSUB 13 are shorting.

Figure 6:
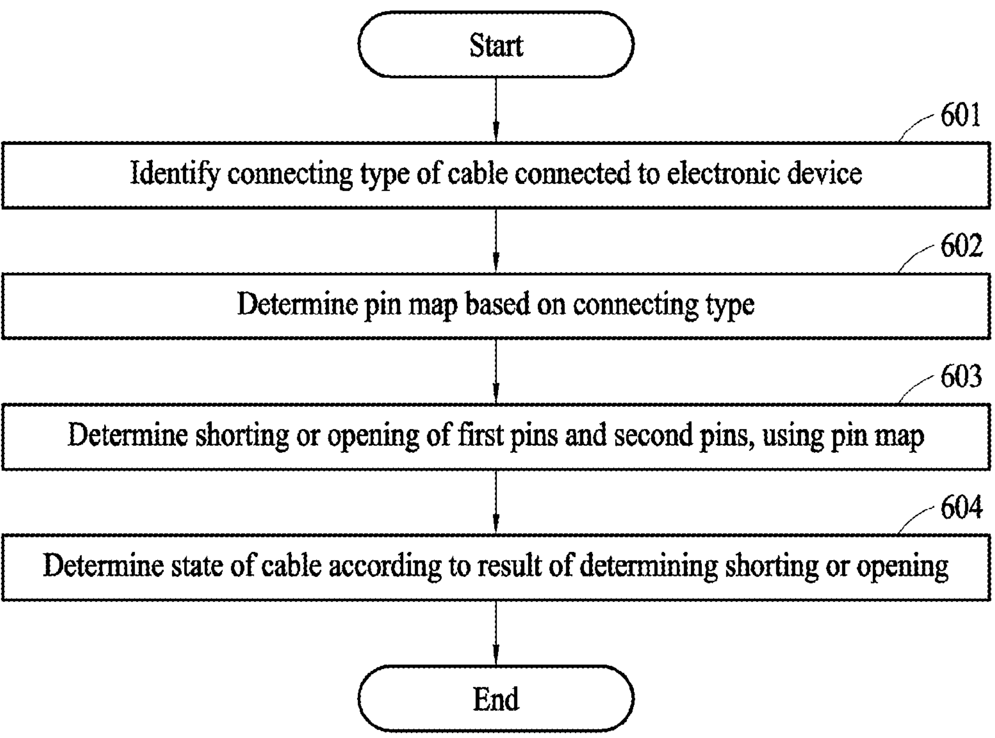
FIG. 6 is a flowchart illustrating an example inspection method according to various embodiments.

FIG. 6 is a flowchart illustrating an example inspection method according to an embodiment.

In operation 601, the electronic device 101 may identify a connecting type of the cable 111 connected to the electronic device 101. In operation 602, the electronic device 101 may determine a pin map based on the connecting type. The pin map may define a second pin corresponding to each first pin for each connecting type and may include information about shorting or opening of the first pin and the second pin corresponding to the first pin.

In operation 603, the electronic device 101 may determine shorting or opening of the first pins and the second pins using the pin map. The electronic device 101 may determine a second pin corresponding to the first pin based on the pin map, may apply a current greater than or equal to a reference level to the first pin, may determine the resistance between the first pin and the determined second pin by receiving the applied current through the determined second pin, and may determine shorting or opening of the first pin and the determined second pin based on the resistance.

In operation 604, the electronic device 101 may determine a state of the cable 111 according to a result of the determining of shorting or opening of the first pins and the second pins. The electronic device 101 may determine the cable 111 to be in an abnormal state, when the determined shorting or opening is different from the shorting or opening defined in the pin map.

For example, when the first pin and the determined second pin are defined as shorting in the pin map determined according to the connecting type and the first pin and the determined second pin are determined to be opening or cold soldering, the electronic device 101 may determine the cable 111 to be in an abnormal state.

An electronic device for inspecting a cable according to an example embodiment includes: a main substrate configured to perform an inspection of the cable, an input substrate electrically connected to the main substrate and the cable, and an output substrate electrically connected to the main substrate and the cable and connected to the input substrate through the cable, wherein the main substrate may include a first selector electrically connected to the output substrate and including a plurality of first pins, a second selector electrically connected to the input substrate and including a plurality of second pins, a processor electrically connected to the first selector and the second selector, and a power supply configured to supply power to the electronic device, wherein the processor may be configured to: identify a connecting type of the cable connected to the electronic device, determine a pin map including information about shorting or opening of the first pins and the second pins based on the connecting type, determine shorting or opening of the first pins and the second pins using the pin map, and determine a state of the cable according to a result of the determining of shorting or opening of the first pins and the second pins.

The processor may be further configured to: determine a second pin corresponding to the first pin based on the pin map, apply a current greater than or equal to a reference level to the first pin, determine the resistance between the first pin and the determined second pin by receiving the applied current through the determined second pin, and determine shorting or opening of the first pin and the determined second pin based on the resistance.

The processor may be further configured to: determine the cable to be in an abnormal state, based on the determined shorting or opening being different from the shorting or opening defined in the pin map.

The processor may be further configured to determine the first pin and the determined second pin as shorting, based on the resistance being less than a shorting threshold, and determine the first pin and the determined second pin as opening, based on the resistance being greater than or equal to an opening threshold that is higher than the shorting threshold.

The processor may be further configured to determine the first pin and the determined second pin as cold soldering, based on the resistance being greater than or equal to a shorting threshold and less than an opening threshold.

The processor may be further configured to determine the cable to be in an abnormal state, based on the first pin and the determined second pin being defined as shorting in the determined pin map and the first pin and the determined second pin being determined to be opening or cold soldering.

The processor may be further configured to determine the cable to be in an abnormal state, based on the first pin and the determined second pin being defined as opening in the determined pin map and the first pin and the determined second pin being determined to be shorting or cold soldering.

The processor may be further configured to determine the cable to be in an abnormal state, based on the first pin and the determined second pin being defined as opening in the determined pin map and the resistance being less than an opening threshold.

The processor may be further configured to determine the cable to be in an abnormal state, based on the first pin and the determined second pin being defined as shorting in the determined pin map and the resistance being greater than or equal to a shorting threshold.

The processor may be further configured to: apply the current greater than or equal to the reference level to the first pin, determine the resistance between the first pin and a second pin adjacent to the determined second pin by receiving the applied current through the second pin adjacent to the determined second pin, and determine crossing of the first pin based on the resistance.

An inspection method of a cable according to an example embodiment includes: identifying a connecting type of a cable connected to an electronic device, determining a pin map including information about shorting or opening of first pins and second pins of the electronic device based on the connecting type, determining shorting or opening of the first pins and the second pins using the pin map, and determining a state of the cable according to a result of the determining of shorting or opening of the first pins and the second pins, wherein the electronic device may include a main substrate configured to perform an inspection of the cable, an input substrate electrically connected to the main substrate and the cable, and an output substrate electrically connected to the main substrate and the cable and connected to the input substrate through the cable, wherein the main substrate may include a first selector electrically connected to the output substrate and including the plurality of first pins, and a second selector electrically connected to the input substrate and including the plurality of second pins.

The determining of shorting or opening of the first pins and the second pins may include: determining a second pin corresponding to the first pin based on the pin map, applying a current greater than or equal to a reference level to the first pin, determining a resistance between the first pin and the determined second pin by receiving the applied current through the determined second pin, and determining shorting or opening of the first pin and the determined second pin based on the resistance.

The determining of the state of the cable may include determining the cable to be in an abnormal state, based on the determined shorting or opening being different from the shorting or opening defined in the pin map.

The determining of shorting or opening of the first pins and the second pins may further include: determining the first pin and the determined second pin as shorting, based on the resistance being less than a shorting threshold, and determining the first pin and the determined second pin as opening, based on the resistance being greater than or equal to an opening threshold that is higher than the shorting threshold.

The determining of shorting or opening of the first pins and the second pins may further include: determining the first pin and the determined second pin as cold soldering, based on the resistance being greater than or equal to a shorting threshold and less than an opening threshold.

The determining of the state of the cable may further include: determining the cable to be in an abnormal state, based on the first pin and the determined second pin being defined as shorting in the determined pin map and the first pin and the determined second pin being determined to be opening or cold soldering.

The determining of the state of the cable may further include: determining the cable to be in an abnormal state, based on the first pin and the determined second pin being defined as opening in the determined pin map and the first pin and the determined second pin being determined to be shorting or cold soldering.

The determining of the state of the cable may further include: determining the cable to be in an abnormal state, based on the first pin and the determined second pin being defined as opening in the determined pin map and the resistance being less than an opening threshold.

The determining of the state of the cable may further include: determining the cable to be in an abnormal state, based on the first pin and the determined second pin being defined as shorting in the determined pin map and the resistance being greater than or equal to a shorting threshold.

The inspection method of the cable may further include: applying a current greater than or equal to the reference level to the first pin, determining a resistance between the first pin and a second pin adjacent to the determined second pin by receiving the applied current through the second pin adjacent to the determined second pin, and determining crossing of the first pin based on the resistance.

The electronic device according to embodiments may be one of various types of electronic devices. The electronic device may include, for example, a portable communication device (e.g., a smartphone), a computer device, a portable multimedia device, a portable medical device, a camera, a wearable device, a home appliance device, or the like. According to an embodiment of the disclosure, the electronic device is not limited to those described above.

It should be appreciated that embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B," "at least one of A and B," "at least one of A or B," "A, B or C," "at least one of A, B and C," and "at least one of A, B, or C," each of which may include any one of the items listed together in the corresponding one of the phrases, or all possible combinations thereof. Terms such as "$1^{st}$," "$2^{nd}$," or "first" or "second" may simply be used to distinguish the component from other components in question, and do not limit the components in other aspects (e.g., importance or order). It is to be understood that if an element (e.g., a first element) is referred to, with or without the term "operatively" or "communicatively," as "coupled with," "coupled to," "connected with," or "connected to" another element (e.g., a second element), the element may be coupled with the other element directly (e.g., by wire), wirelessly, or via a third element.

As used in connection with embodiments of the disclosure, the term "module" may include a unit implemented in hardware, software, or firmware, or any combination thereof, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

According to embodiments, each component (e.g., a module or a program) of the above-described components may include a single entity or multiple entities, and some of the multiple entities may be separately disposed in different components. According to embodiments, one or more of the above-described components may be omitted, or one or more other components may be added. Alternatively or additionally, a plurality of components (e.g., modules or programs) may be integrated into a single component. In such a case, according to embodiments, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device for inspecting a cable, the electronic device comprising:
a main substrate configured to perform an inspection of the cable;
an input substrate electrically connected to the main substrate and the cable; and
an output substrate electrically connected to the main substrate and the cable and connected to the input substrate through the cable,
wherein the main substrate comprises:
a first selector electrically connected to the output substrate and comprising a plurality of first pins;
a second selector electrically connected to the input substrate and comprising a plurality of second pins;
at least one processor comprising processor circuitry electrically connected to the first selector and the second selector; and
a power supply configured to supply power to the electronic device,
wherein the at least one processor is configured, individually and/or collectively, to:
identify a connecting type of the cable connected to the electronic device,
determine a pin map comprising information about shorting or opening of the first pins and the second pins based on the connecting type,
determine cold soldering of the first pins and the second pins based on the pin map, a shorting threshold, and an opening threshold, and
determine a state of the cable based on a result of the determining of cold soldering of the first pins and the second pins and the pin map.

2. The electronic device of claim 1, wherein
the at least one processor is further configured, individually and/or collectively, to:
determine a second pin corresponding to a first pin based on the pin map, apply a current greater than or equal to a reference level to the first pin,
determine a resistance between the first pin and the determined second pin by receiving the applied current through the determined second pin, and
determine the first pin and the determined second pin as cold soldering, based on the resistance being greater than or equal to a shorting threshold and less than an opening threshold.

3. The electronic device of claim 1, wherein the at least one processor is further configured, individually and/or collectively, to:
determine shorting or opening of the first pins and the second pins based on the pin map, the shorting threshold, and the opening threshold.

4. The electronic device of claim 3, wherein the at least one processor is further configured, individually and/or collectively, to:
determine a second pin corresponding to the first pin based on the pin map, apply a current greater than or equal to a reference level to the first pin,
determine a resistance between the first pin and the determined second pin by receiving the applied current through the determined second pin, and
determine the shorting or opening of the first pin and the determined second pin based on the resistance, the shortening threshold and the opening threshold.

5. The electronic device of claim 4, wherein
the at least one processor is further configured, individually and/or collectively, to: determine the first pin and the determined second pin as shorting, based on the resistance being less than the shorting threshold, and determine the first pin and the determined second pin as opening, based on the resistance being greater than or equal to the opening threshold greater than the shorting threshold.

6. The electronic device of claim 4, wherein
the at least one processor is further configured, individually and/or collectively, to: determine the cable to be in an abnormal state, based on the first pin and the determined second pin being defined as opening in the determined pin map and the resistance being less than the opening threshold.

7. The electronic device of claim 4, wherein
the at least one processor is further configured, individually and/or collectively, to: determine the cable to be in an abnormal state, based on the first pin and the determined second pin being defined as shorting in the determined pin map and the resistance being greater than or equal to the shorting threshold.

8. The electronic device of claim 4, wherein
the at least one processor is further configured, individually and/or collectively, to: apply the current greater than or equal to the reference level to the first pin, determine a resistance between the first pin and a second pin adjacent to the determined second pin by receiving the applied current through the second pin adjacent to the determined second pin and determine crossing of the first pin based on the resistance.

9. The electronic device of claim 3, wherein
the at least one processor is further configured, individually and/or collectively, to: determine the cable to be in an abnormal state, based on the determined shorting or opening being different from the shorting or opening defined in the pin map.

10. An method of inspecting a cable, the inspection method comprising:
identifying a connecting type of a cable connected to an electronic device;
determining a pin map comprising information about shorting or opening of first pins and second pins of the electronic device based on the connecting type;
determining cold soldering of the first pins and the second pins based on the pin map, a shorting threshold, and an opening threshold; and
determining a state of the cable based on a result of the determining of cold soldering of the first pins and the second pins and the pin map,
wherein the electronic device comprises:
a main substrate configured to perform an inspection of the cable,
an input substrate electrically connected to the main substrate and the cable, and
an output substrate electrically connected to the main substrate and the cable and connected to the input substrate through the cable,
wherein the main substrate comprises a first selector electrically connected to the output substrate and comprising the plurality of first pins, and a second selector electrically connected to the input substrate and comprising the plurality of second pins.

11. The method of claim 10, further comprising:

determining shorting or opening of the first pins and the second pins based on the pin map, the shorting threshold, and the opening threshold.

12. The method of claim 11, wherein the determining of shorting or opening of the first pins and the second pins comprises:

determining a second pin corresponding to the first pin based on the pin map, applying a current greater than or equal to a reference level to the first pin, determining a resistance between the first pin and the determined second pin by receiving the applied current through the determined second pin, and determining shorting or opening of the first pin and the determined second pin based on the resistance, the shorting threshold and the opening threshold.

13. The method of claim 12, wherein the determining of shorting or opening of the first pins and the second pins further comprises:

determining the first pin and the determined second pin as shorting, based on the resistance being less than the shorting threshold, and determining the first pin and the determined second pin as opening, based on the resistance being greater than or equal to the opening threshold greater than the shorting threshold.

14. The method of claim 12, further comprising:

upon determining a second pin corresponding to a first pin based on the pin map, applying a current greater than or equal to a reference level to the first pin, determining a resistance between the first pin and the determined second pin by receiving the applied current through the determined second pin, and determining the first pin and the determined second pin as cold soldering, based on the resistance being greater than or equal to the shorting threshold and less than the opening threshold.

15. The method of claim 12, further comprising:

applying the current greater than or equal to the reference level to the first pin, determining a resistance between the first pin and a second pin adjacent to the determined second pin by receiving the applied current through the second pin adjacent to the determined second pin, and determining crossing of the first pin based on the resistance.

16. The method of claim 11, wherein the determining of the state of the cable comprises: determining the cable to be in an abnormal state, based on the determined shorting or opening being different from the shorting or opening defined in the pin map.

* * * * *